United States Patent [19]

Konishi

[11] Patent Number: 5,289,431
[45] Date of Patent: Feb. 22, 1994

[54] SEMICONDUCTOR MEMORY DEVICE DIVIDED INTO BLOCKS AND OPERABLE TO READ AND WRITE DATA THROUGH DIFFERENT DATA LINES AND OPERATION METHOD OF THE SAME

[75] Inventor: Yasuhiro Konishi, Hyogo, Japan

[73] Assignee: Mitsubishi Denki Kabushiki Kaisha, Tokyo, Japan

[21] Appl. No.: 952,929

[22] Filed: Sep. 29, 1992

[30] Foreign Application Priority Data

Oct. 29, 1991 [JP] Japan .................................. 3-282773

[51] Int. Cl.$^5$ ........................... G11C 8/00; G11C 7/00
[52] U.S. Cl. ............................ 365/230.03; 365/189.01; 365/189.04
[58] Field of Search ................. 365/230.03, 230.01, 365/189.01, 189.04, 190, 203, 207

[56] References Cited

U.S. PATENT DOCUMENTS

| | | | |
|---|---|---|---|
| 4,725,945 | 2/1988 | Krowstadt et al. | 365/230.03 |
| 4,755,971 | 7/1988 | Jasmer et al. | 365/189.04 |
| 4,954,992 | 9/1990 | Kumanoya et al. | 365/207 |
| 5,060,145 | 10/1991 | Scheuneman et al. | 365/230.03 |

OTHER PUBLICATIONS

"A 1.5V Circuit Technology for 64Mb DRAMs", Y. Nakagome et al., IEEE 1990 Symposium on VLSI Circuits, Digest of Technical Papers, pp. 17-18.
"A 40ns 64Mb DRAM with Current-Sensing Data-Bus Amplifier", M. Taguchi et al., 1991 IEEE International Solid-State Circuits Conference, Digest of Technical Papers, pp. 112-113.

Primary Examiner—Eugene R. LaRoche
Assistant Examiner—Tan Nguyen
Attorney, Agent, or Firm—Lowe, Price, LeBlanc & Becker

[57] ABSTRACT

In a DRAM of separated I/O type, column selecting lines for reading data and column selecting lines for writing data are provided independently from each other. An addition circuit is provided corresponding to each memory cell array block for precharging, when that memory cell array is not selected, a read line pair corresponding that memory cell array block to the same potential Vb1 as that of the bit lines equalized by an equalizer circuit. Both in data reading and writing operations, current does not flow between any equalizer circuit and the write data line pair provided corresponding to each unselected memory cell array block in spite of the fact that a transistor for write selection is not provided in each bit line pair.

14 Claims, 11 Drawing Sheets

SEMICONDUCTOR MEMORY DEVICE DIVIDED INTO BLOCKS AND OPERABLE TO READ AND WRITE DATA THROUGH DIFFERENT DATA LINES AND OPERATION METHOD OF THE SAME

BACKGROUND OF THE INVENTION

1. Field of the Invention

The invention relates, in general, to a semiconductor memory device and an operation method of the same, and particularly to a semiconductor memory device having data lines which are provided independently from each other for reading and writing data, respectively, and an operation method of the same.

2. Description of the Prior Art

DRAMs (Dynamic Random Access Memories) have such features that memory capacities can be easily increased, as compared with SRAMs (Static Random Access Memories), but they require a relatively long time for reading and writing data.

Reduction of the access time of DRAMs has been attempted from various aspects. In one aspect, it relies on improvement of components and elements of the DRAM such as advance of performance of transistors in the DRAM and reduction of a signal delay time of interconnections in the DRAM, which are achieved by the advance of the process technology of the semiconductor integrated circuit device. In another aspect, it relies on improvement of circuit constructions of the DRAM achieved by the design technology of the semiconductor integrated circuit device.

The reduction of the access time of the DRAM has been mainly realized from the former aspect. In recent years, however, remarkable reduction of the access time of the DRAM has been attempted from the latter aspect.

The latter attempt is based on a following view. A major cause of preventing the reduction of the access time in the conventional DRAM is that "in a data reading operation, it is impossible to operate a sense amplifier immediately after activation of a word line connected to memory cells from which the data is to be read". This attempt will be described below in detail with reference to FIGS. 7-11.

FIG. 7 is a circuit diagram showing a construction of a major portion of the conventional DRAM to which the above attempt is not applied.

With reference to FIG. 7, a memory cell array block MA includes memory cells MC which are disposed in a row direction and a column direction to form a matrix, word lines WL which are provided correspondingly to rows of the memory cells, respectively, and bit line pairs BL, /BL which are provided correspondingly to columns of the memory cells, respectively.

Each memory cell MC is formed of an N-channel MOS transistor 100 having its gate connected to corresponding word line WL, and a capacitor 200. Transistor 100 and capacitor 200 are mutually connected in series between one of the two bit lines BL and /BL forming the corresponding bit line pair and a cell plate supplying a low potential Vsg.

In the data writing operation and data reading operation, a potential (nearly equal to power supply potential Vcc) at a high level is supplied to one of word lines WL. In all memory cells MC connected to this one word line WL, transistors 100 are turned on, and thus capacitors 200 are electrically connected to corresponding bit lines BL or /BL, respectively.

A sense amplifier SA and a bit line equalizer circuit EQ are connected between two bit lines BL and /BL forming each bit line pair.

Each sense amplifier SA includes two P-channel MOS transistors 300 and 310 connected between two signal lines 360 and 370, and two N-channel MOS transistors 320 and 330 connected between two signal lines 360 and 370. Between signal lines 360 and 370, transistors 300 and 320 are connected in series and also transistors 310 and 330 are connected in series. A connecting point of transistors 300 and 320 is connected to one (BL) of the two bit lines forming the corresponding bit line pair and is also connected to gates of transistors 310 and 330. Similarly, a connecting point of transistors 310 and 330 is connected to the other bit line /BL and gates of transistors 300 and 320.

Accordingly, each sense amplifier SA is activated while signal lines 360 and 370 are receiving supply potential Vcc and ground potential Vss corresponding to the low level, respectively. The activated sense amplifier SA operates as a differential amplifier, which amplifies a potential difference between corresponding two bit lines BL and /BL, and also operates as a temporary memory circuit, which latches the potentials of corresponding two bit lines BL and /BL at the connecting point of transistors 300 and 320 and the connecting point of transistors 310 and 330, respectively.

Each bit line equalizer circuit EQ includes N-channel MOS transistors 400 and 410 which are connected in series between two bit lines BL and /BL forming the corresponding bit line pair. An equalization control signal $\phi EQ$ is commonly applied to gates of transistors 400 and 410 in all equalizer circuits EQ. In each equalizer circuit EQ, an intermediate potential $Vb1$ ($=Vcc/2$) between supply potential Vcc and ground potential Vss is applied to the connecting point of transistors 400 and 410.

In the data writing and reading operations, equalization signal $\phi EQ$ is at the low level. Thereby, transistors 400 and 410 are turned off in each equalizer circuit EQ, so that intermediate potential $Vb1$ is not applied to any bit pair BL and /BL. When neither data reading operation nor data writing operation is to be carried out, equalization signal $\phi EQ$ is at the high level. Thereby, transistors 400 and 410 are turned on in each equalizer circuit EQ, so that each bit lines BL and bit line /BL paired therewith are set equally at the intermediate potential $Vb1$.

Sense amplifier activation signals $\phi pSA$ and $\phi nSA$ are applied to signal lines 360 and 370, respectively. By setting sense amplifier activation signals $\phi pSA$ and $\phi nSA$ to have supply potential Vcc and ground potential Vss, respectively, all sense amplifiers SA are activated.

Each bit line BL and bit line /BL paired therewith are connected through N-channel MOS transistors 500 and 510 to data lines /IO and IO, respectively. Transistor 500 connected to bit line BL and transistor 510 connected to bit line /BL paired with bit line BL have gates connected to a common column selecting line CSL. Thus, one column selecting line CSL is provided correspondingly to each bit line pair.

In the data writing and reading operations, the potential at the high level is applied to only one of the column selecting lines CSL. Thereby, both transistors 500 and 510 connected to this one column selecting line CSL are turned on, so that only one bit line pair BL and /BL corresponding to this one column selecting line CSL is electrically connected to data line pair IO and /IO.

Now, a general circuit operation for writing the data will be described below.

In the data writing operation, mutually complementary potentials are externally applied, as write data, to data line pair IO and /IO.

The potentials of data lines IO and /IO are transmitted to transistors 500 and 510 through bit lines corresponding to the one column selecting line to which the potential at the high level is applied (hereinafter referred to as selected bit lines).

The potentials of selected bit lines BL and /BL are latched at nodes N1 and N2 in corresponding sense amplifier SA, respectively.

In memory cell array block MA, if memory cell MC connected to one word line to which the potential at the high level is applied (hereinafter referred to as selected word line) is connected to bit line BL, charging or discharging, which depends on the potential latched in node N1, is caused in capacitor 200 in one memory cell MC connected commonly to selected bit line BL and selected word line WL (hereinafter referred to as selected memory cell).

Meanwhile, if memory cell MC connected to selected word line WL is connected to bit line /BL (one selected bit line), charging or discharging, which depends on the potential latched in node N2, is caused in capacitor 200 in one memory cell MC connected commonly to another selected bit line /BL and the selected word line WL.

Therefore, charging and discharging of capacitor 200 in selected memory cell MC are caused if the write data, i.e., the potential applied to data line IO (if this memory cell is connected to bit line BL) or data line /IO (if this memory cell is connected to bit line /BL) is at the high level and the low level, respectively. The state in which capacitor 200 has been charged and the state in which capacitor 200 has not been charged correspond to data "1" and data "0", respectively.

In this manner, the write data supplied to data line pair IO and /IO is written only in selected one memory cell MC.

In the data reading operation, the data is transmitted from memory cell array MA to data line pair IO and /IO. General circuit operation for reading the data will be described below with reference to FIGS. 7 and 8.

FIG. 8 is a timing chart showing variation of the potentials in some signal lines and some control signals in FIG. 7 in the data reading operation.

When after the fall of bit line equalization signal $\phi$EQ (FIG. 8(a)), the potential of one of the word lines WL rises, as shown in FIG. 8(b), to a potential (Vcc+$\alpha$) which is slightly higher than the power supply potential Vcc, depending on the stored data in each memory cell MC connected to this word line WL, the potential of bit line BL or /BL connected to this memory cell MC changes.

In a memory cell MC, when transistor 100 is turned on in such conditions that capacitor 200 has been charged, the connecting point between capacitor 200 and transistor 100 has the potential at the high level and bit line BL or /BL connected to this memory cell MC has intermediate potential Vb1, the charge is supplied to this bit line from capacitor 200, so that the potential of this bit line rises from the intermediate potential Vb1. Meanwhile, in a memory cell MC, when transistor 100 is turned on in such conditions that capacitor 200 has not been charged, the connecting point between capacitor 200 and transistor 100 has the potential at the low level and bit line BL or /BL connected to this memory cell MC has the intermediate potential Vb1, the charges flow from the bit line to capacitor 200, so that the potential of this bit line lowers from the intermediate potential Vb1. Since the capacitor 200 has a very small capacity, the potential of the bit line rises and lowers only to a very small extent in the above cases.

In response to the rise of potential of one word line WL, therefore, the potential of each bit line BL (if the memory cell MC connected to this word line WL is connected to bit line BL) or each bit line /BL (if the memory cell MC connected to this word line WL is connected to bit line /BL) slightly rises or lowers from intermediate potential Vb1, as shown in FIG. 8(c), depending on the stored data in one memory cell connected to the selected word line among a plurality of memory cells connected to this bit line. Thereby, a small potential difference is generated between two bit lines BL and /BL forming each bit line pair. Each sense amplifier SA is employed for amplifying the small potential difference between the corresponding bit lines BL and /BL to a value corresponding to the difference between ground potential Vss and supply potential Vcc.

Each sense amplifier SA is activated with a considerable delay after the rise of potential of any word line WL. For this purpose, sense amplifier activation signals $\phi$nSA and $\phi$nSA are set to the supply potential Vcc and ground potential Vss with a considerable delay after the rise of potential of any word line WL, as shown in FIGS. 8(e) and 8(d). Each sense amplifier SA is inactivated when both sense amplifier activation signals $\phi$pSA and $\phi$nSA are set to the intermediate potential Vb1.

Owing to the activation of each sense amplifier SA at the above timing, sense amplifier SA starts to sense and amplify the potential difference between the corresponding bit lines, when the potential difference between two bit lines BL and /BL forming corresponding bit line pair increases to some extent.

As a result, the potential of bit line BL or /BL having the slightly raised potential is raised to supply potential Vcc, as indicated by solid line (1) in FIG. 8(c), in response to the rise of sense amplifier activation signal $\phi$pSA (i.e., fall of sense amplifier activation signal $\phi$nSA). Meanwhile, the potential of the bit line /BL or BL paired with the above bit line is lowered to ground potential Vss, as indicated by dashed line(3), in response to the rise of sense amplifier activation signal $\phi$pSA (i.e., fall of sense amplifier activation signal $\phi$nSA).

Conversely, the potential of bit line BL or /BL having the slightly lowered potential is lowered to ground potential Vss, as indicated by solid line (2) in FIG. 8(c), in response to the fall of sense amplifier activation signal $\phi$nSA (i.e., rise of sense amplifier activation signal $\phi$pSA). Meanwhile, the potential of bit line /BL or BL paired with the above bit line is raised to supply potential Vcc from intermediate potential Vb1, as indicated by dashed line (4), in response to the fall of sense amplifier activation signal $\phi$nSA (i.e., rise of sense amplifier activation signal $\phi$pSA).

In this manner, each bit line pair BL and /BL have the potentials at the complementary logical levels which depend on the stored data in corresponding one among a plurality of memory cells MC connected to selected word line WL.

However, only the potentials appearing on the selected bit line pair are transmitted to data line pair IO and /IO through transistors 500 and 510. For this purpose, the potential of only one of column selecting lines CSL is raised to supply potential Vcc, as shown in FIG. 8(f), after the activation of sense amplifier SA, and thus transistors 500 and 510 provided between corresponding bit line pair BL and /BL and data line pair IO and /IO are turned on.

In this manner, the complementary potentials which correspond to the stored data in one memory cell MC connected commonly to selected word line WL and selected bit line BL or /BL are transmitted to data line pair IO and /IO. The potentials transmitted to data line pair IO and /IO are externally supplied therefrom as the read data.

In the above data reading operation, the charges move between capacitor 200 in the selected memory cell MC and bit line BL or /BL connected to the selected memory cell, which causes rising or lowering of potential of node N1 or N2 in sense amplifier SA connected to this bit line. This rising or lowering to the sufficient extent requires a time of about 10 ns. Thus, it requires a considerable time until the potential difference corresponding to the stored data in selected memory cell MC is sufficiently generated between inputs N1 and N2 of sense amplifier SA connected to selected bit line pair.

Sense amplifier SA operates to sense the potential difference between its inputs N1 and N2, i.e., potential difference between corresponding bit lines BL and /BL. If this potential difference is small, the sense amplifier SA may malfunction to raise the potential of the bit line which should be lowered to ground potential Vss or to lower the potential of the bit line which should be raised to supply potential Vcc. Therefore, if sense amplifier SA is activated immediately after the rising of potential of one of word lines WL, sense amplifier SA connected to the selected bit line pair starts to operate, before the sufficient potential difference is generated between selected bit lines BL and /BL in accordance with the stored data in selected memory cell MC. Thus, sense amplifier SA may malfunction to incorrectly determine the stored data in selected memory cell MC.

In order to prevent the incorrect determination of sense amplifier SA, sense amplifier SA is activated when a certain time elapses after the rise of potential of one word line WL, i.e., when the potential difference caused by the stored data in the selected memory cell MC between selected bit lines BL and /BL increases to some extent. A waiting time is required after the rise of potential of one word line WL and before the activation of sense amplifier SA. In order to reliably prevent the malfunction of sense amplifier SA, this waiting time is set slightly longer than a time which is required after the rise of potential of one word line WL and before the potential difference between the selected bit lines BL and /BL reaches the maximum value corresponding to the capacity of the capacitor 200 in selected memory cell MC.

Therefore, even if the potential difference corresponding to the stored data in selected memory cell MC is generated between selected bit lines BL and /BL before sense amplifier SA is activated, the time is not reduced, which is after the selection of one word line WL and before the complementary potentials corresponding to the stored data in selected memory cell MC appear in data line pair IO and /IO. Consequently, it is impossible to increase the speed of the data reading operation in the conventional DRAM.

There has been proposed a DRAM, of which data reading operation does not require a time margin between the start of operation of the sense amplifier for determining the stored data in the selected memory cell and the rise of potential of one word line, e.g., by Y. Nakagome et al, "Symposium on VLSI Circuits, Dig of Tech. Papers", pp 17–18, 1990, and M. Taguchi et al, "1991 IEEE International Solid-State Circuits Conference", pp 112–113.

FIG. 9 is a circuit diagram showing a construction of a major part of such DRAM.

A DRAM shown in FIG. 9 is different from the conventional DRAM shown in FIG. 7 in that a data line pair WDB and /WDB for receiving the write data is provided independently from a data line pair RDB and /RDB for receiving the read data and that a sense amplifier RSA for amplifying the potential difference between the selected bit lines BL and /BL in the data reading operation is provided independently from sense amplifiers WSA for latching the complementary potentials corresponding to the write data in the data writing operation.

Further, read data input circuits RD are provided correspondingly to respective bit line pairs for transmitting the variation of potentials of the bit line pairs BL and /BL to read sense amplifier RSA. Also, transistors 600 and 610 for write selection are provided correspondingly to each bit line pair for interrupting flow of unnecessary current between each bit line pair BL and /BL and write data line pair WDB and /WDB.

Now, circuit operations of this DRAM for writing and reading the data will be described below with reference to FIG. 10.

FIG. 10 is a timing chart showing variation of potentials appearing on some signal lines in the circuitry in FIG. 9 in the data writing operation and data reading operation.

First, the circuit operation for reading the data will be described below.

In the data reading operation, write data line pair WDB and /WDB receives the complementary potentials, as the write data.

Write data line WDB is connected through transistors 500 and 600 to bit line BL, and write data line /WDB is connected through transistors 510 and 610 to bit line /BL paired with bit line BL. Write selection transistors 600 and 610 have gates to which a write selection signal φWS is commonly applied. In the operation for writing the data in memory cell array block MA, write selection signal φWS is raised to supply potential Vcc as shown in FIG. 10(h), so that all the write selection transistors 600 and 610 are turned on. Therefore, in response to the rise of potential of one column selecting line CSL, the potentials of write data lines WDB and /WDB are transmitted to selected bit lines BL and /BL, respectively.

A circuit which forms write sense amplifier WSA and has the same construction as sense amplifier SA in FIG. 7 is disposed between two bit lines BL and /BL forming each bit line pair. Therefore, the potentials transmitted to selected bit lines BL and /BL are latched at nodes N1 and N2 in corresponding write sense amplifier WSA, respectively.

If the memory cell MC connected to selected word line WL is connected to bit line BL, the data is written in selected memory cell MC in accordance with the potential latched at node N1. If the memory cell MC connected to selected word line WL is connected to bit line /BL, the data is written in selected memory cell MC in accordance with the potential latched at node N2.

As described above, this DRAM performs the data writing operation in a manner similar to the conventional circuit operation.

The circuit operation for reading the data will be described below.

In all the memory cell array blocks, write selection signal φWS is at the ground potential Vss, as shown in FIG. 10(h). Thus, all write selection transistors 600 and 610 are turned off to electrically isolate bit lines BL and /BL and write data lines WDB and /WDB from each other. Therefore, when the potential (FIG. 10(b)) of one of word lines WL rises after the fall of bit line equalization signal φEQ (FIG. 10(a)), the potential of each bit line BL or /BL slightly rises or lowers from the potential Vb1 in response, which it has held, on the principle similar to that of the prior art, as shown in FIG. 10(c).

Meanwhile, the potential of one column selecting line CSL is raised, as shown in FIG. 10(f), at the substantially same timing as the rise of potential of one word line WL. In this DRAM, each column selecting line CSL is connected not only to the gates of bit line selection transistors 500 and 510 but also to corresponding read data input circuit RD.

Each read data input circuit RD includes N-channel MOS transistors 700 and 710 having gates respectively connected to corresponding bit lines BL and /BL and N-channel MOS transistors 720 and 730 each having a gate connected to corresponding column selecting line CSL.

Transistors 700 and 720 are connected in series between the ground GND and read data line RDB. Transistors 710 and 730 are connected in series between the ground GND and read data line /RDB.

Accordingly, at the time that the difference potential corresponding to the stored data in selected memory cell MC starts to generate between selected bit lines BL and /BL, transistors 700 and 710 of which gates are connected to these bit lines, respectively, have already been electrically connected to read data line pair RDB and /RDB.

Read sense amplifier RSA includes P-channel MOS transistors 740 and 760 connected in series between read data line RDB and power supply Vcc, and a P-channel MOS transistor 750. Transistor 750 is connected between read data line /RDB and transistor 760. Transistors 740 and 750 have gates commonly connected to read data line RDB. Thus, read sense amplifier RSA operates to amplify the potential difference between read data lines RDB and /RDB while read sense amplifier activation signal φRSA applied to the gate of transistor 760 is at the low level. Meanwhile, the elements 740, 750, 760, 700, 710, 720 and 730 serve as a current mirror.

Read sense amplifier activation signal φRSA falls to the low level, as shown in FIG. 10(g), at substantially the same timing as the rise of potential of one word line WL. Therefore, when the potential difference corresponding to the stored data in selected memory cell MC starts to be generated between selected bit lines BL and /BL, read sense amplifier RSA is already activated, and is electrically connected to transistors 700 and 710 connected to selected bit lines BL and /BL.

Therefore, upon generation of the potential difference between the selected bit lines BL and /BL, the difference of the voltages applied to the transistors 700 and 710 causes difference of the currents taken out from the transistors 700 and 710, in read data input circuit RD connected to these bit lines. On the other hand, since transistors 740 and 750 have respective gates connected together, a big potential difference appears between read data lines RDB and /RDB due to the difference between a current flowing through the transistors 700 and 720 and a current flowing through the transistors 710 and 730.

If the bit line BL has a higher potential as compared with the bit line /BL, the potential on the read data line /RDB swings to a low level while the potential on the read data line RDB swings to a high level, since the transistor 700 has a larger current driving capability than the transistor 710.

Conversely, if the line BL has a lower potential as compared with the line /BL, the potential on the line RDB swings to a low level while the potential on the line /RDB swings to a high level, since the transistor 710 has a larger current driving capability than the transistor 700.

As described in the foregoing, a current mirror amplifier comprising a read sense amplifier RSA and a read data input circuit RD is responsive to a very small potential difference appearing in bit line pair immediately after rising of the potential on a word line, to amplify the potential difference and provide a big potential difference to the read data lines RDB and /RDB.

Also in the data reading operation, write sense amplifier WSA is activated at the same timing as the sense amplifier SA in FIG. 7. Thus, sense amplifier activation signals φpSA and φnSA go to supply potential Vcc and the ground potential Vss (see FIGS. 10(d) and 10(e)) with a considerable delay after the rise of one word line WL. Thereby, write sense amplifier WSA operates when the potential difference corresponding to stored data in selected memory cell MC sufficiently generates between selected bit lines BL and /BL.

When the sense amplifier WSA starts to operate, the potential difference between selected bit lines BL and /BL increases, so that transistor 700 or 710 in read data input circuit RD connected to bit lines BL and /BL goes to more strongly turned-on state, which increases the current flowing from read data line RDB or /RDB. Consequently, read sense amplifier RSA operates more accurately. The sense amplifier WSA is activated in order to rewrite the data of a memory cell.

In the DRAM, as described above, the variation of potentials appeared on selected bit lines BL and /BL is transmitted through the gates of transistors 700 and 710 to read sense amplifier RSA. Therefore, even if read sense amplifier RSA malfunctions due to the small potential difference between selected bit lines BL and /BL and thus the potentials of read data lines RDB and /RDB start to change contrary to the stored data in selected memory cell MC, the potentials of selected bit lines BL and /BL are not affected by incorrect variation of the potentials of the read data lines RDB and /RDB. Thus, the data read from selected memory cell MC to selected bit lines BL and /BL is not broken.

By virtue of the operation of write sense amplifier WSA, the potentials of selected bit lines BL and /BL reliably attain to the values corresponding to the stored data in selected memory cell MC. When potential difference between the selected bit lines BL and /BL is sufficiently increased owing to the operation of write sense amplifier WSA, the operation is accurately performed to set the potentials of write data lines RDB and /RDB at values corresponding to the potential difference between selected bit lines BL and /BL.

Therefore, the potentials of read data lines RDB and /RDB reliably attain to the values corresponding to the stored data in selected memory cell MC, even if the time of start of the operation of read sense amplifier RSA is not delayed from the time of rise of potential of word line WL.

Conversely, if sense amplifier SA in FIG. 7 malfunctions in the data reading operation, the potentials themselves of selected bit lines BL and /BL do not reflect the stored data in selected memory cell MC, so that incorrect data ultimately appears on data lines IO and /IO. In addition, the data in the memory cell which should be rewritten correctly is damaged, which is a big problem.

In the data reading and writing operations, bit line selection transistors 500 and 510 which are provided correspondingly to selected bit lines BL and /BL, respectively, are turned on. Therefore, selected bit lines BL and /BL would be electrically connected by corresponding bit line selection transistors 500 and 510 to write data lines WDB and /WDB, respectively, if write selection transistors 600 and 610 do not exist. Meanwhile, write data lines WDB and /WDB are fixed at supply potential Vcc or the ground potential Vss in the operations other than that for writing the data in corresponding memory cell array block MA.

Generally, the DRAM includes a plurality of memory cell array blocks MA, and a plurality of write data line pairs WDB and /WDB are provided correspondingly to them.

FIG. 11 is a schematic block diagram showing a whole construction of a DRAM in which write data line pairs WDB and /WDB are provided independently from read data line pairs RDB and /RDB.

With reference to FIG. 11, when a plurality of memory cell array blocks MA are disposed in a column direction, for each memory cell array block MA, there are provided write data line pair WDB and /WDB and write sense amplifier WSA connected to bit line pairs BL and /BL in the memory cell array block as well as one read data line pair RDB and /RDB, read data input circuit RD connected to bit line pairs BL and /BL in memory cell array block and one read sense amplifier RSA.

Column selecting lines CSL are provided commonly to memory cell array blocks MA. Thus, memory cell array blocks MA include the same number of columns of memory cells. Gates of transistors 500 and 510 as well as transistors 720 and 730, which are connected to bit line pair corresponding to the same column, are commonly connected to the same column selecting line CSL.

In the data writing and reading operations, column decoder CD selectively applies the potential at the high level to one of column selecting lines CSL. Therefore, in the data reading and writing operations, the potential at the high level is applied to one of the column selecting lines CSL in each memory cell array block MA.

Word lines WL, however, are provided independently in respective memory cell array blocks MA. In the data reading and writing operations, row decoder RDE supplies a potential (Vcc+α) slightly higher than supply potential Vcc to one of the word lines WL in any one of the memory cell arrays MA. Therefore, both the potentials of one column selecting line CSL and one word line WL go to the high level only in one memory cell array block MA. Consequently, the data is written in and read from selected memory cells MC only in this one memory cell array block MA.

Each write data line pair WDB and /WDB is electrically connected to a common write data line pair GWDB and /GWDB only while corresponding memory cell array MA is selected. In the data writing operation, the write data, i.e., the potentials at the complementary logical levels are supplied to common write data line pair GWDB and /GWDB. These complementary potentials are applied through corresponding write data line pair WDB and /WDB only to one of the bit line pairs BL and /BL in selected memory cell array block MA, i.e., memory cell array block MA including word line WL to which the high potential is applied from row decoder RDE. More specifically, bit line pair BL and /BL to which the complementary potentials are actually applied is the bit line pair connected to one column selecting line CSL to which the potential at the high level is applied from column decoder CD.

As described above, since the memory cell array is divided into memory cell array blocks MA in the practical construction, the potential of one column selecting line CSL has the high level in not only selected memory cell array block but also each of unselected memory cell array blocks in both the data reading operation and data writing operation.

Therefore, in FIG. 9, even when memory array block MA is not selected transistors 500 and 510 connected to one of bit line pairs BL and /BL in unselected memory cell array block MA are turned on. When memory cell array block MA is not selected, write data lines WDB and /WDB which are provided correspondingly to unselected memory cell array block MA are fixed at supply potential Vcc or the ground potential Vss.

Meanwhile, each bit line pair BL and /BL in unselected memory cell array block MA is equalized by bit line equalizer circuit EQ connected thereto to an intermediate potential Vb1. Therefore, if write selection transistors 600 and 610 were not provided, current flows from a power supply feeding the intermediate potential Vb1 to the equalizer circuit EQ (hereinafter referred to as a bit line precharge power supply: not shown) to write data line WDB through the selected bit line BL and transistors 400 and 500 connected to this bit line, and current flows between bit line precharge power supply and the other write data line /WDB through the other selected bit line /BL and transistors 410 and 510 connected thereto, in each of the non-selected blocks.

As described above, if bit line selection transistors 600 and 610 were not provided, useless current would flow between the bit line precharge power supply and the power supply for supplying supply potential Vcc or the ground potential Vss to write data line pair WDB and /WDB, in each unselected block, resulting in increase of power consumption. Bit line selection transistors 600 and 610 are provided for preventing the above problem.

In the data reading and writing operations, all write selection transistors 600 and 610 which are provided correspondingly to the unselected blocks receive write selection signal φWS at the low level to be turned off, so that current paths between bit lines BL and /BL and write data line pairs WDB and /WDB are interrupted in these unselected blocks, respectively. In each unselected block, therefore, the current does not flow between write data line pair WDB and /WDB and bit line precharge power supply through bit line pair BL and /BL corresponding to one column selecting line CSL to which the potential at the high level is applied.

As described above, the DRAM of a so-called separated I/O type, which is independently provided with read data line pairs and write data line pairs, requires read data input circuits RD and two write selection transistors 600 and 610 which are provided correspondingly to the respective bit line pairs. Each read data input circuit RD is formed of four transistors 700, 710, 720 and 730, as shown in FIG. 9.

Therefore, the DRAM of separated I/O type has a construction identical with the construction in which six transistors are additionally provided correspondingly to each bit line pair in a DRAM of so-called common I/O type in which read data lines and write data line pairs are common to each other (see FIG. 7).

The DRAM of separated I/O type requires a signal line for supplying selection signal φWS for controlling the write selection transistors to the gates of write selection transistors 600 and 610.

Therefore, the DRAM of separated I/O type in the prior art has a large number of components, elements and signal lines, so that it occupies larger chip area than that the DRAM of common I/O type.

In order to avoid the above problem, the write selection transistors may be eliminated. In this case, however, the current flows between the bit line precharge power supply and power supply for applying Vss or Vcc through write data line pairs WDB and /WDB in the unselected blocks, on the principle described above.

Thus, it is difficult to suppress both the increase of the occupied chip area and increase of the power consumption in the conventional DRAM in which the access time in the data reading operation is reduced.

SUMMARY OF THE INVENTION

An object of the invention is to provide a semiconductor memory device in which an access time in a data reading operation is reduced.

Another object of the invention is to reduce an access time in a data reading operation of a semiconductor memory device without increasing occupied chip area.

Still another object of the invention is to reduce an access time in a data reading operation of a semiconductor memory device without increasing power consumption.

A further object of the invention is to provide a semiconductor memory device in which a current does not flow between a bit line precharge power supply and a write data line pair in an unselected block.

Yet another object of the invention is to provide a semiconductor memory device which does not require a selection transistor between a write data line pair and a bit line.

A semiconductor memory device according to an aspect of the invention includes a plurality of blocks each including a plurality of memory cells disposed in rows and columns and a plurality of bit lines provided corresponding to the plurality of columns; a block selecting circuit for selecting any of the blocks; a first selecting circuit which selects one bit line in each of the blocks in a data writing operation; and a second selecting circuit which selects one bit line in each of the blocks in a data reading operation. The semiconductor memory device according to the invention further includes, corresponding to respective blocks, a plurality of write data buses, a plurality of read data buses, a plurality of connecting circuits, a plurality of read amplifying circuits, a plurality of equalizer circuits, and a plurality of precharging circuits.

Each write data bus receives write data, and each read data bus externally transmits read data. Each connecting circuit electrically connects the bit lines selected by the first selecting circuit in the corresponding block to the corresponding write data bus. Each transmitting circuit transmits potential variation in the bit line selected by the second selecting circuit in the corresponding block to the corresponding read data bus. Each read amplifier circuit amplifies the potential variation transmitted by the corresponding transmitting circuit. Each equalizer circuit equalizes all the bit lines in the corresponding block to a predetermined potential, when the corresponding block is not selected by the block selecting circuit. Each precharging circuit precharges the corresponding write data bus to the same potential as the predetermined potential, when the corresponding block is not selected by the block selecting circuit.

Each memory cell is preferably a dynamic memory cell. Each of the write data buses and read data buses is preferably formed of two signal lines for transmitting complementary signals. In each block, the adjacent two bit lines form a pair for transmitting complementary signals.

Since the semiconductor memory device according to the invention includes the precharge circuits having the above construction, each write data bus is precharged to the same potential as that of the bit line equalized by the equalizer circuit while the data should not be written in any of the memory cells in the block provided corresponding to the same write data bus. Therefore, even if one of the bit lines in the block is electrically connected to the write data bus during the above period, current does not flow between this bit line and the write data bus.

Since the connecting circuit and the transmitting circuit are controlled independently from each other, the current does not flow between any bit line and the write data bus in each block in the data reading operation if all the connecting circuits are disabled.

According to another aspect, the invention provides an operation method of a semiconductor memory device including a plurality of blocks, each of which includes memory cells disposed in a plurality of rows and a plurality of columns, a plurality of bit lines provided corresponding to the plurality of columns, a write data bus for receiving write data, and a read data bus for externally transmitting read data. The method comprises the steps of: selecting any of the bit lines in each of the plurality of blocks in a data writing operation; selecting any of the bit lines in each of the plurality of blocks in a data reading operation; selecting any of the plurality of blocks; electrically connecting the selected bit line to the corresponding write data bus in each of the blocks; transmitting potential variation in the selected bit line to the corresponding read data bus in each of the blocks; electrically amplifying the transmitted potential variation; equalizing all of the bit lines in the each unselected block to a predetermined potential; and precharging the write data bus in the each unselected block to the predetermined potential.

According to this operation method, the write data bus is forced to the same potential as the equalized bit line in the each unselected block in the data writing operation. Therefore, in the data writing operation, the current does not flow between the write data bus in the each unselected block and the bit lines electrically connected thereto.

Accordingly, the present invention provides the semiconductor memory device in which data reading time and power consumption are reduced without increasing a chip area.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
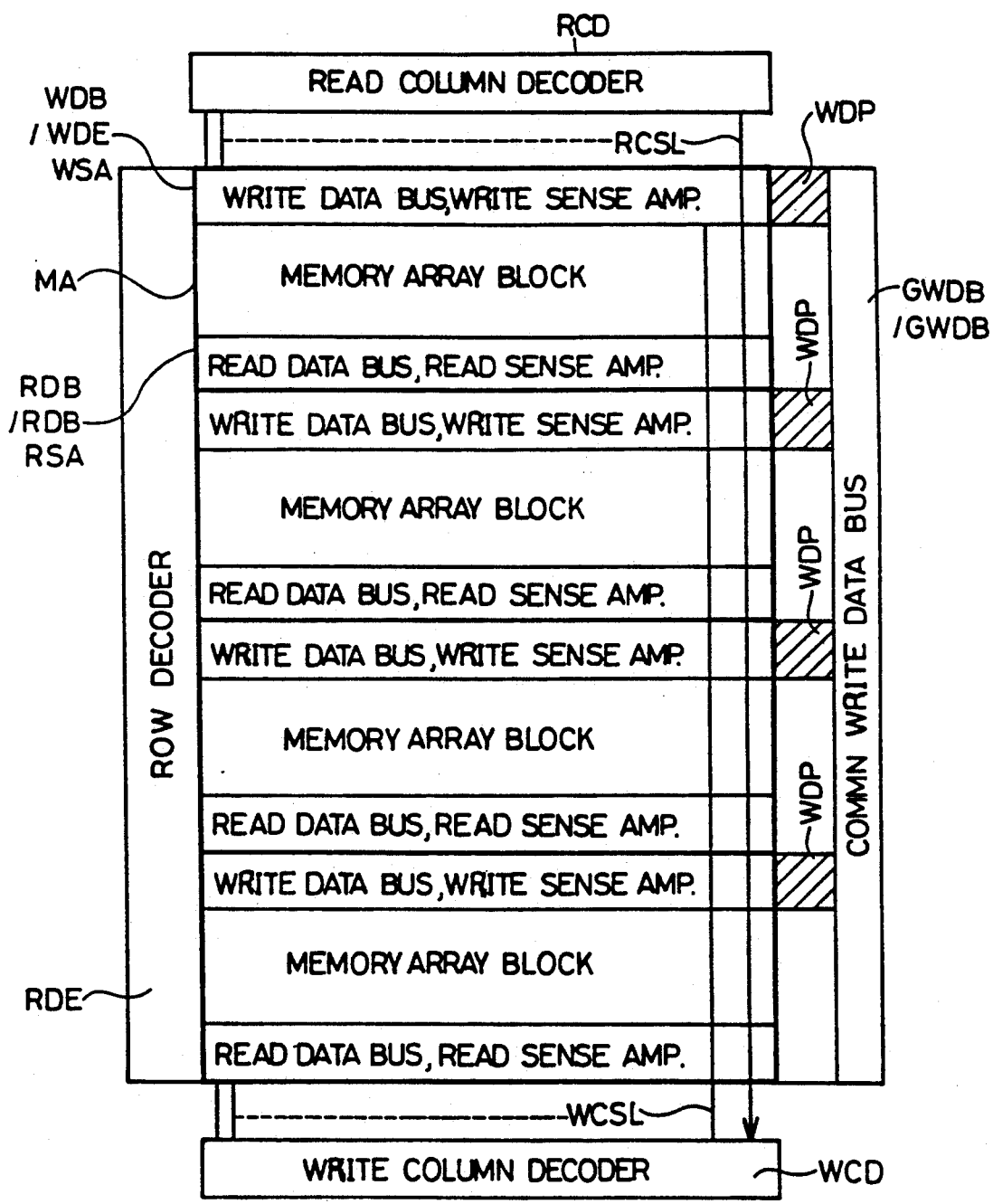
FIG. 1 is a schematic block diagram showing a whole structure of a DRAM of an embodiment of the invention.

FIG. 1 is a schematic block diagram showing a whole structure of a DRAM of separated I/O type, in accordance with one embodiment of the invention. Referring to FIG. 1, the DRAM is different from the conventional DRAM shown in FIG. 11 in that column selecting lines include two types of column selecting lines RCSL for reading data and column selecting lines WCSL for reading data, that write data line precharge circuits WDP are provided corresponding to respective memory cell arrays MA and that write selection transistors 600 and 610 (see FIG. 9) are not provided.

Read column decoder RCD is provided for setting the potential of any one of the read column selecting lines RCSL at the high level, and write column decoder WCD is provided for setting the potential of any one of the column selecting lines WCSL at the high level.

Figure 9:
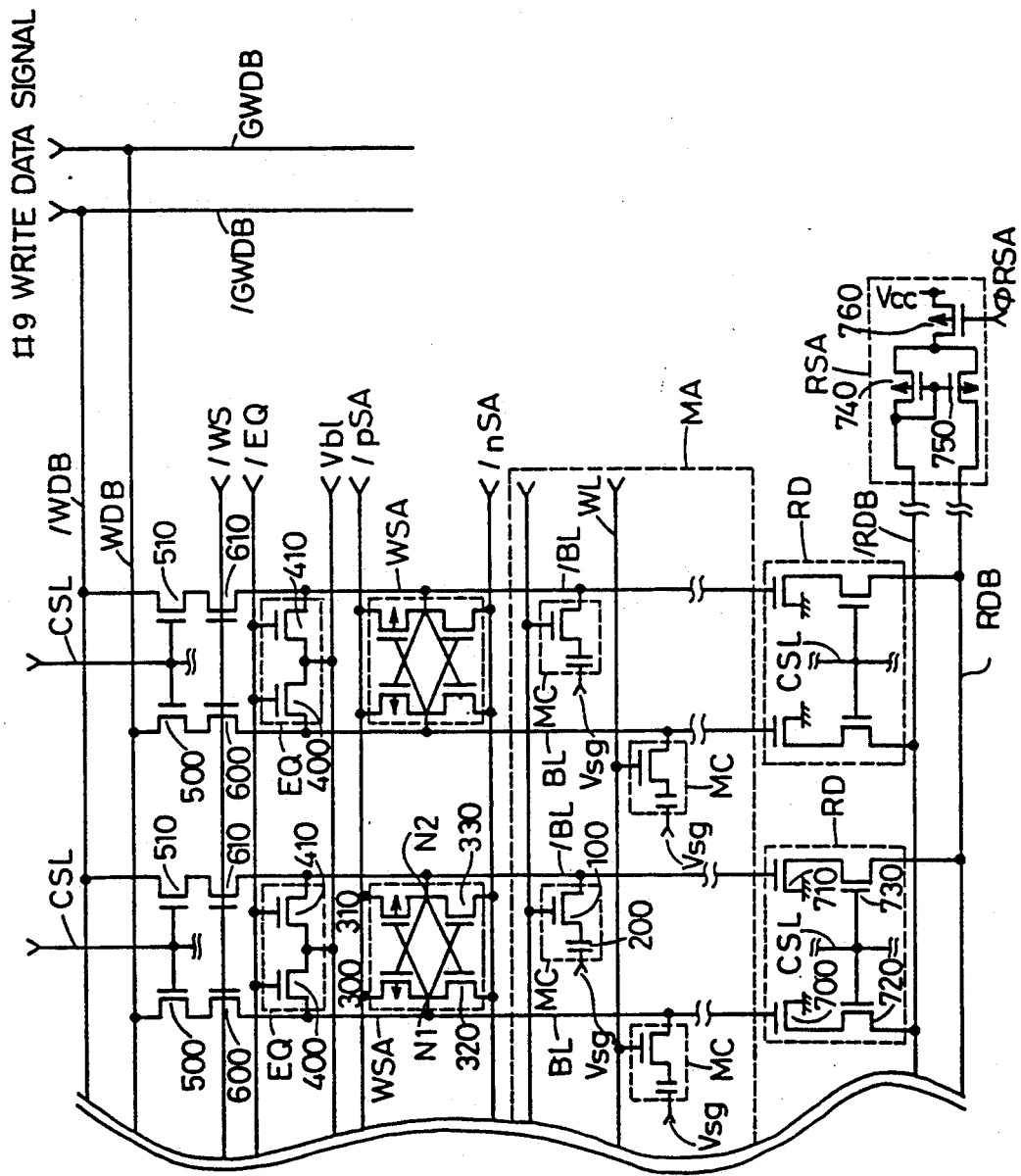
FIG. 9 is a circuit diagram showing a structure of a major part of a DRAM of separated I/O type in the prior art.
Figure 10:
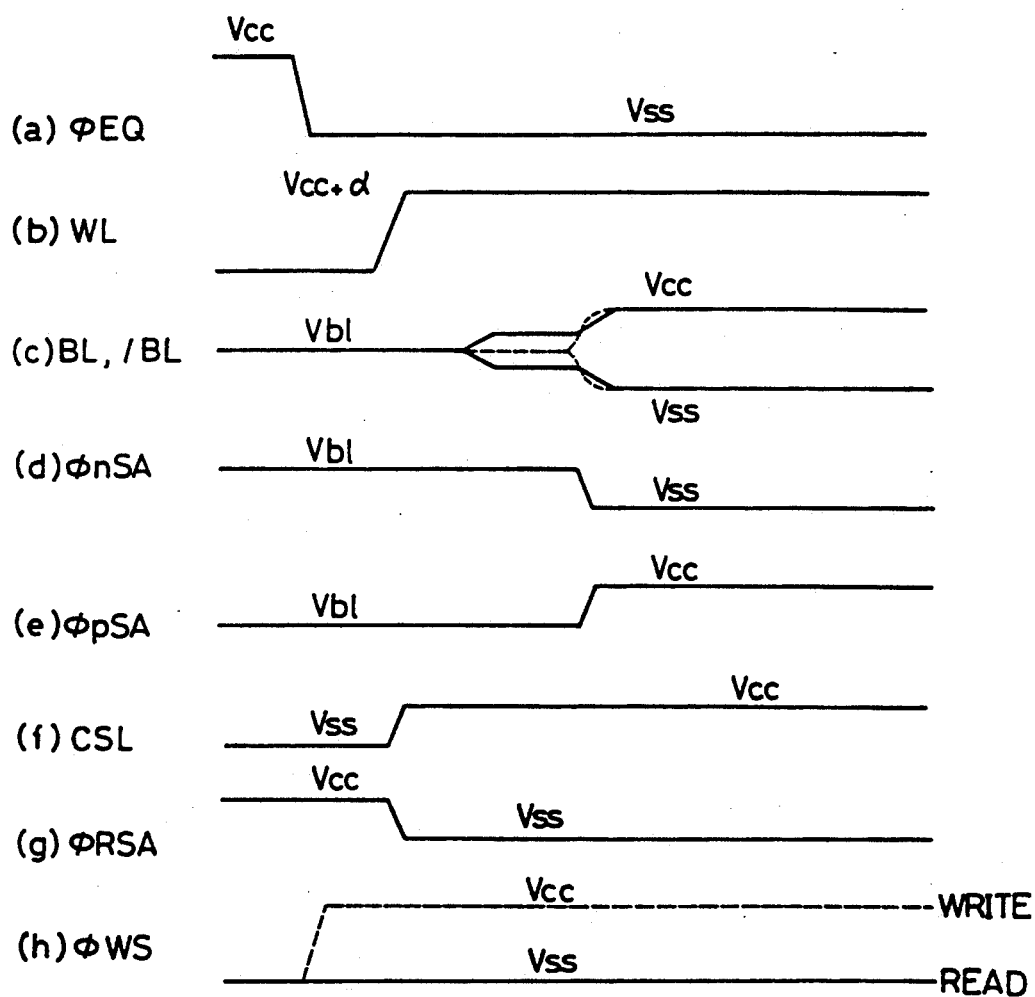
FIG. 10(a)-(h) is a timing chart showing a circuit operation in data writing and reading of a DRAM shown in FIG. 9.
Figure 11:
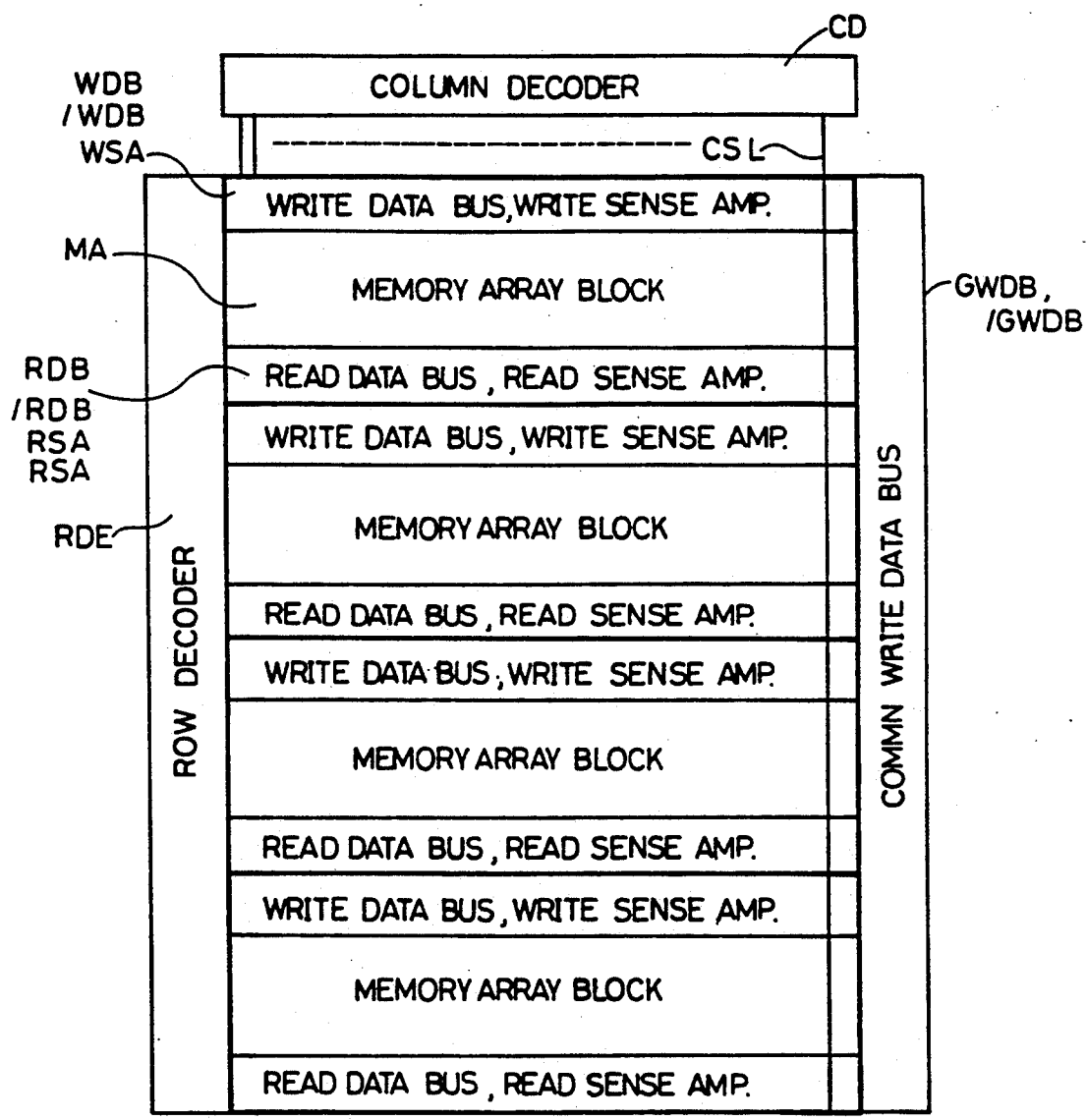
FIG. 11 is a schematic block diagram showing a whole structure of a DRAM of separated I/O type in the prior art.

The structure and operation of the circuitry other than read column decoder RCD and write column decoder WCD as well as write data line precharge circuits WDP are similar to those of the conventional DRAM shown in FIGS. 9 and 11.

Both read column selecting lines RCSL and write column selecting lines WCSL are provided commonly to all memory cell arrays MA. In this DRAM also, one memory cell array MA as well as write sense amplifiers WSA to memory cell array MA, write data line pair WDB and /WDB, read data input circuits RD, read data lines RDB and /RDB, bit line equalizer circuits EQ, read sense amplifier RSA and write data line precharge circuit WDP provided corresponding thereto are treated as one block.

Figure 2:
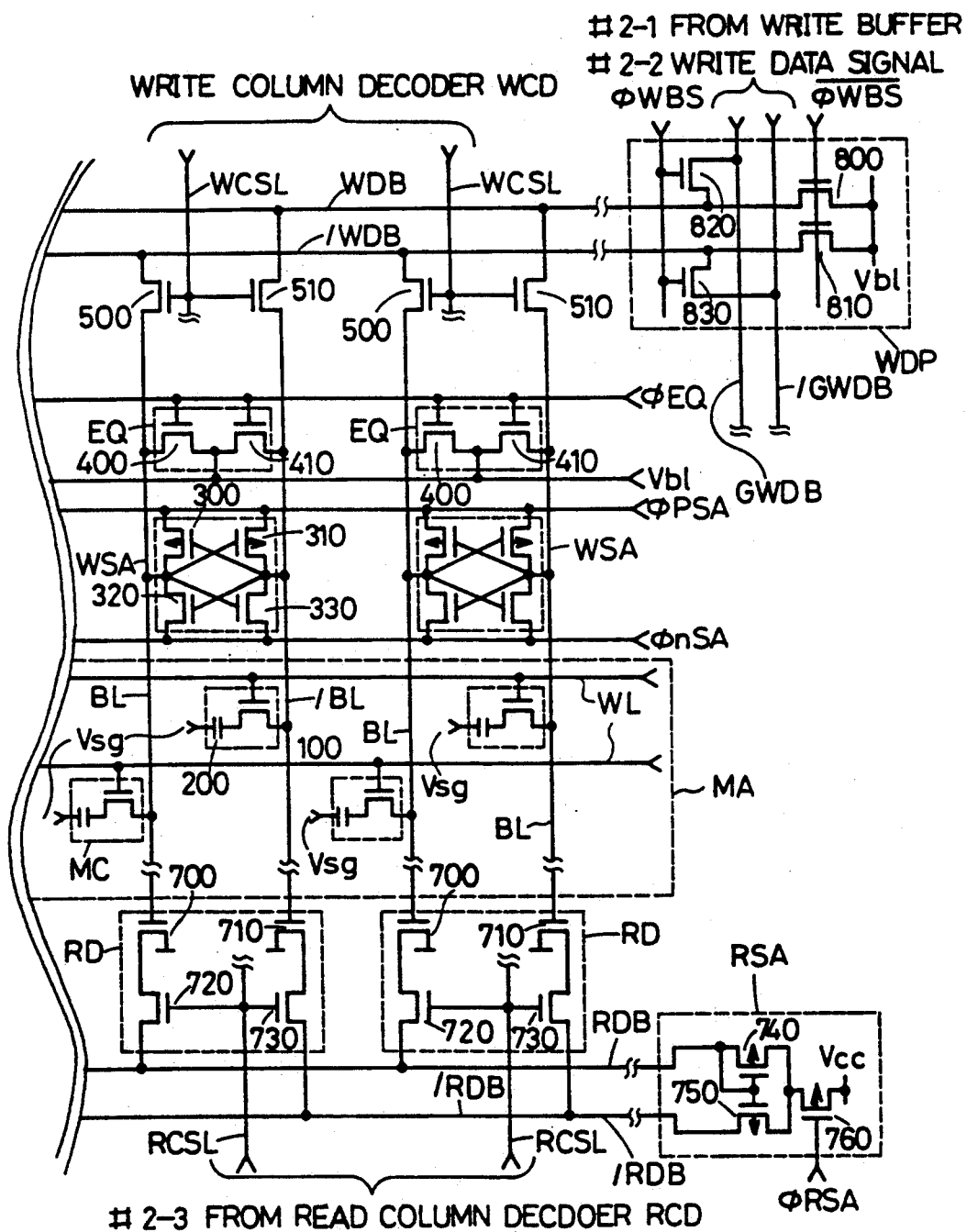
FIG. 2 is a circuit diagram showing a structure of one memory cell array block shown in FIG. 1 and a peripheral circuit thereof.

FIG. 2 is a circuit diagram showing a structure of arbitrary one of the blocks shown in FIG. 1.

Now, specific circuit operations of the DRAM for reading and writing data will be described below with reference to FIGS. 1-4.

Figure 3:
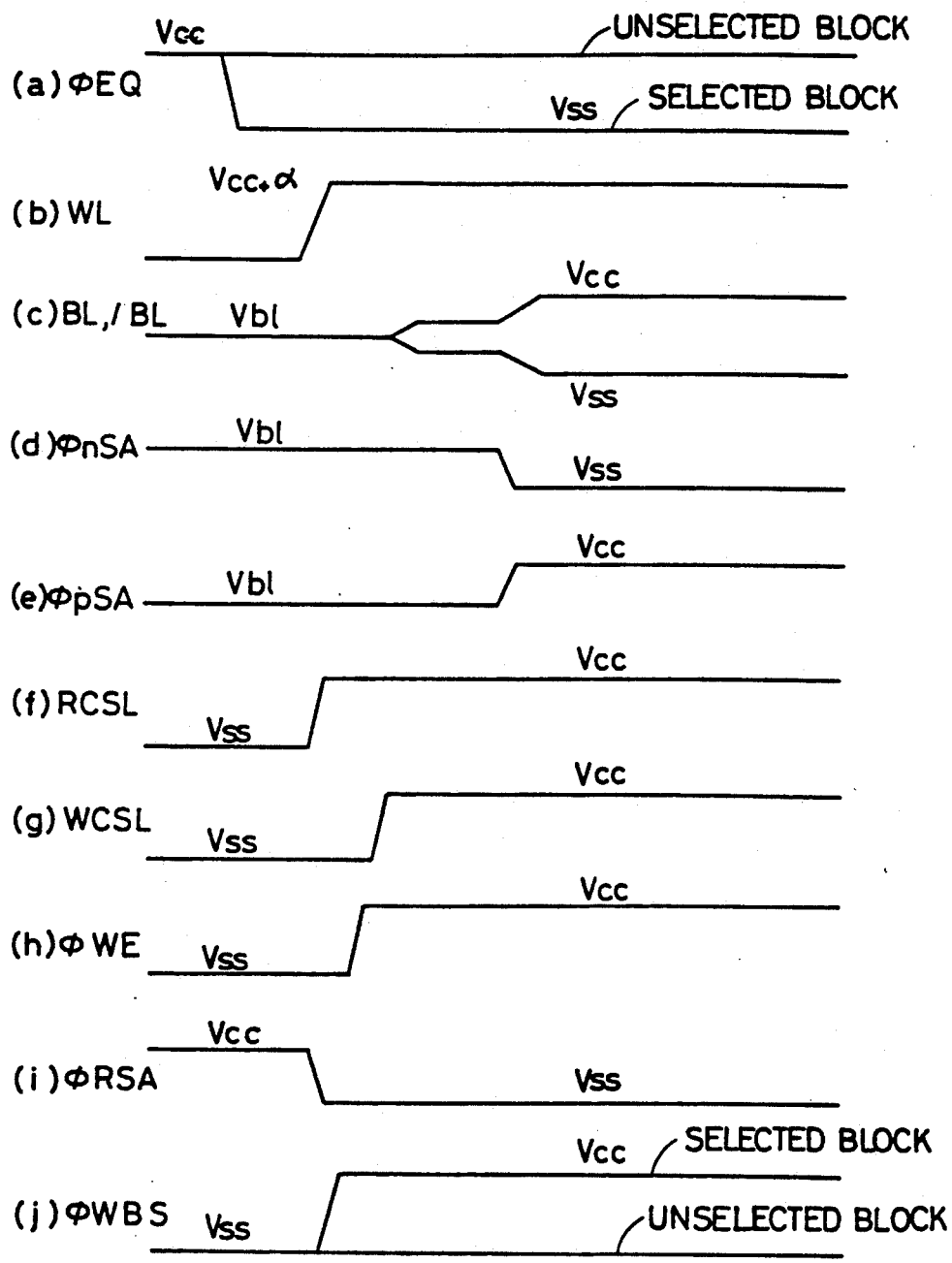
FIGS. 3(a)-(j) is a timing chart showing a circuit operation in a data writing operation of a DRAM shown in FIGS. 1 and 2.
Figure 4:
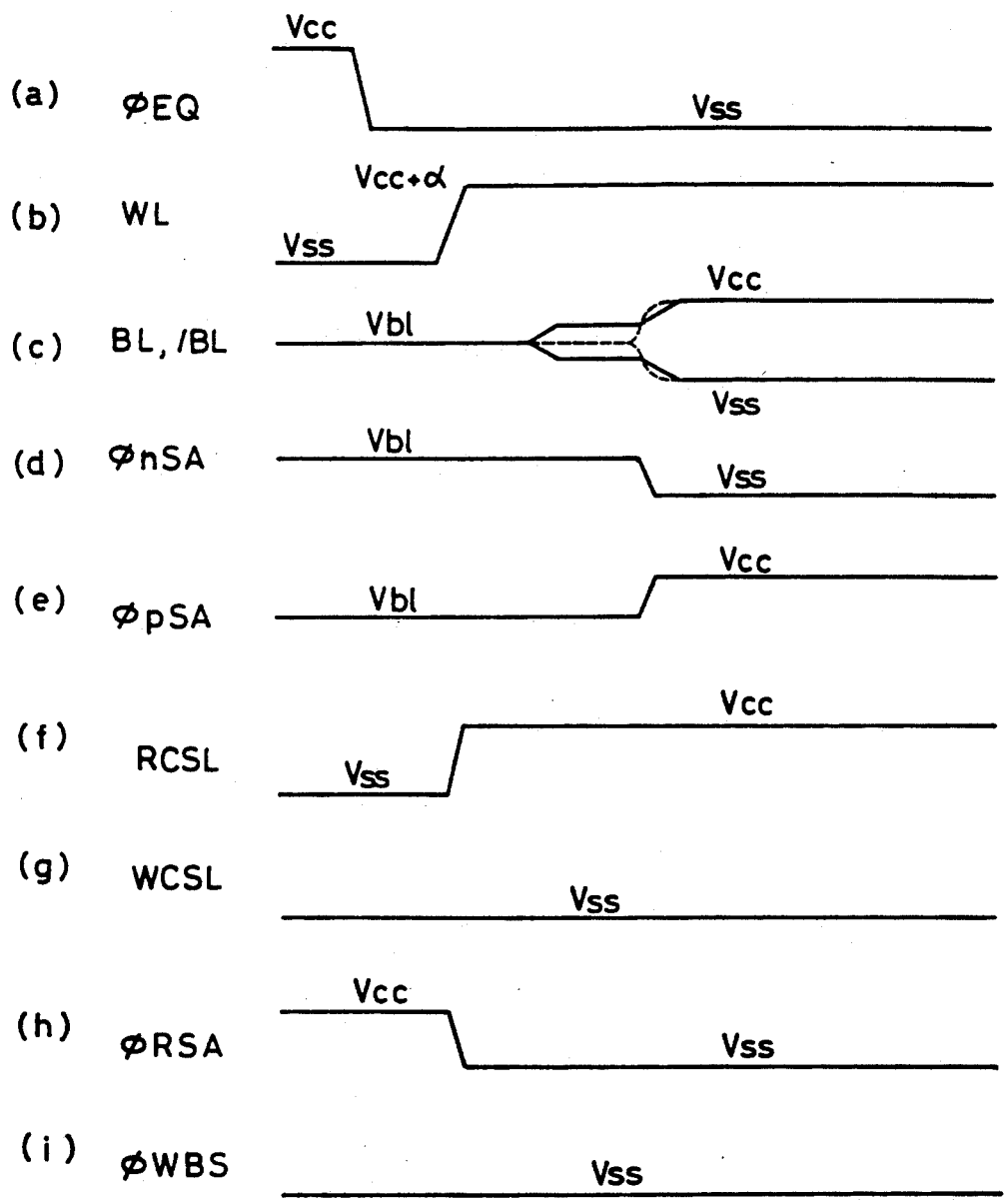
FIGS. 4(a)-(i) is a timing chart showing a circuit operation in a data reading operation of a DRAM shown in FIGS. 1 and 2.

FIGS. 3 and 4 are timing charts showing variation of the potentials of some signals and some signal lines in FIG. 2 in the data writing and reading operations.

Read data input circuit RD having the conventional structure is connected between each bit line pair BL and /BL and read data line pair RDB and /RDB, and bit line selection transistors 500 and 510 having the conventional construction are connected between each bit line pair BL and /BL and write data line pair WDB and /WDB. In the embodiment, however, column selecting line WCSL connected to the gates of bit line selection transistors 500 and 510 provided corresponding to a bit line pair BL and /BL is independent from column selecting line RCSL connected to gates of transistors 720 and 730 in read data input circuit RD provided corresponding to the same bit line pair.

Specifically, one write column selecting line WCSL and one read column selecting line RCSL are provided corresponding to each bit line pair BL and /BL. Each write column selecting line WCSL is connected commonly to the gates of bit line selection transistors 500 and 510 connected to corresponding bit line pair BL and /BL. Each read column selecting line RCSL is connected commonly to the gates of transistors 720 and 730 in read data input circuit RD provided corresponding to the same bit line pair BL and /BL. Therefore, write column selecting line WCSL is connected to one set of bit line selection transistors 500 and 510 in every memory cell array MA in FIG. 1. Similarly, read column selecting line RCSL is connected to one set of read data input transistors 720 and 730 in every memory cell array MA in FIG. 1.

In the data writing operation, write column decoder WCD in FIG. 1 applies the potential at the high level to any one of write column selecting lines WCSL.

In the data writing operation, therefore, in any one of the memory cell array blocks MA the potential of any one of the word lines WL has a potential (Vcc+α) slightly higher than supply potential Vcc, as shown in FIG. 3(b) and the potential of any one of the write column selecting liens WCSL rises to supply potential Vcc, as shown in FIG. 3(g).

In response to the rise of potential of a word line WL, capacitor 200 in each memory cell MC connected to the word line WL is electrically connected to corresponding bit line BL or /BL. In response to the rise of potential of a write column selecting line WCSL, bit line pair BL and /BL corresponding to the write column selecting line WCSL is electrically connected to write data line pair WDB and /WDB owing to the conduction of bit line selection transistors 500 and 510 connected thereto.

Meanwhile, write data line precharge circuit WDP is connected to each write data line pair WDB and /WDB.

Each write data line precharge circuit WDP includes N-channel MOS transistors 800 and 810 connected in series between corresponding write data lines WDB and /WDB and the bit line precharge power supply (not shown), and N-channel MOS transistors 820 and 830 which are disposed between corresponding write data lines WDB and /WDB and common write data lines GWDB and /GWDB, respectively.

In each write data line precharge circuit WDP, transistors 800 and 810 and transistors 820 and 830 are collectively controlled by a write block write signal φWBS and an inverted signal thereof. More specifically, each write data line precharge circuit WDP is controlled by write block selection signal φWBS which is not utilized for other write data line precharge circuits WDP.

Each write block selection signal φWBS attains supply potential Vcc when the potential of a word line WL in corresponding memory cell array block MA rises in the data writing operation.

Therefore, in the data writing operation, transistors 820 and 830 are turned on and transistors 800 and 810 are turned off in write data line precharge circuit WDP provided corresponding to selected memory cell array block MA, and read data lines WDB and /WDB provided corresponding to memory cell array block MA are electrically connected to common write data lines GWDB and /GWDB through transistors 820 and 830 in corresponding write data line precharge circuit WDP. Therefore, the write data, i.e., complementary potentials applied to common write data lines GWDB and /GWDB are transmitted to write data lines WDB and /WDB in the selected block, respectively.

Consequently, in the selected block, the complementary potentials which are transmitted, as the write data, to write data lines WDB and /WDB are transmitted to selected bit lines BL and /BL, respectively.

Specifically, equalization signal φEQ to be applied to selected block falls to the ground potential Vss, as shown in FIG. 3(a), so that the potentials of selected bit lines BL and /BL complimentarily change, as shown in FIG. 3(c), from intermediate potential Vb1 owing to the potentials of write data lines WDB and /WDB in response to the rise of potential of corresponding write column selecting line WCSL. This slight change is amplified by write sense amplifier WSA.

Sense amplifier activation signals φpSA and φnSA to be applied to selected block vary from intermediate potential Vb1 to supply potential Vcc and to the ground potential Vss, respectively, after a certain time from the rise of potential of word line WL, as shown in FIGS. 3(e) and 3(d). thus, write sense amplifier WSA connected to selected bit line pair BL and /BL operates to increase the potential difference to the difference between power supply potential Vcc and the round potential Vss (see FIG. 3(c)), after the sufficient potential difference is generated between the selected bit lines BL and /BL by the write data. Further, write sense amplifier WSA latches the potentials of selected bit lines BL and /BL at nodes N1 and N2 after the amplification thereof.

In response to one of the complementary potentials latched at nodes N1 and N2 in write sense amplifier WSA, capacitor 200 in selected memory cell MC is discharged or charged, whereby the writing in selected memory cell MC is completed.

In practice, externally applied write data signal is amplified by a write buffer (not shown) and the amplified signal is supplied to common write data line pair GWDB and /GWDB.

The foregoing is the circuit operation of the selected block for writing the data. Circuit operations of unselected blocks in the data writing will be described below.

In each unselected block, write block selection signal φWBS at the ground potential Vss is applied to write data line precharge circuits WDP, as shown in FIG. 3(j). In write data line precharge circuit WDP in each unselected block, therefore, transistors 800 and 810 are turned on, and transistors 820 and 830 are turned off, which is converse to the operation of write data line precharge circuit WDP in the selected block.

In each unselected block, therefore, write data lines WDB and /WDB are electrically connected to bit line precharge power supply through transistors 800 and 810 in corresponding write data line precharge circuit WDP, and thus are precharged to the intermediate potential Vb1.

Also in each unselected block, any one of the write column selecting lines WCSL is set to the high level, so that a pair of bit line selection transistors 500 and 510 connected to this one write column selecting line WCSL are turned on to electrically connect write data lines WDB and /WDB to selected bit lines BL and /BL, respectively.

Further, each unselected block receives equalization signal φEQ at the high level as shown in FIG. 3(a), so that transistors 400 and 410 in all equalizer circuits EQ are turned on in each unselected block, and thus all bit line pairs BL and /BL are equalized to the intermediate potential Vb1. Accordingly, bit lines BL and /BL equalized to intermediate potential Vb1 are electrically connected to write data lines WDB and /WDB, respectively.

In the embodiment, however, write data lines WDB and /WDB are precharged by corresponding precharge circuit WDP to intermediate potential Vb1. Therefore, even if bit line selection transistors 500 and 510 provided between equalized bit line pair BL and /BL and write data line pair WDB and /WDB are turned on, the current does not flow between the bit line pair and the write data line pair.

As described above, in the embodiment, the flow of current between the selected bit line pair and the write data line pair in each unselected block is interrupted in the data writing operation, without write selection transistors 600 and 610 connected in series to bit line selection transistors 500 and 510 in the conventional DRAM of separated I/O type (see FIG. 9). In other words, since there are provided circuits WDP operable to precharge write data lines WDB and /WDB provided corresponding to unselected memory cell arrays MA to the same potential Vb1 as that of equalized bit lines BL and /BL, it is not necessary to provide two write selection transistors 600 and 610 for each bit line pair BL and /BL in order to interrupt the electrical connection between bit line pair BL and /BL and write data line pair WDB and /WDB in each unselected memory cell array MA.

In the conventional DRAM of separated I/O type shown in FIG. 9, two write selection transistors are provided corresponding to each bit line pair BL and /BL in every memory cell array block MA in order to prevent the flow of the useless current between bit line precharge power supply and write data lines WDB and /WDB in each unselected block. Therefore, the DRAM is additionally provided with write selection transistors, of which number is equal to the double of product of the number of bit line pairs in one memory cell array block MA and the number of memory cell array blocks MA. In the embodiment, each memory cell array MA is provided with only one write data line precharge circuit WDP formed of four transistors 800, 810, 820 and 830 in order to prevent the flow of such useless current, and thus the number of circuit elements can be remarkably reduced, as compared with the conventional DRAM of separated I/O type.

In the data writing operation, the potential of read column selecting line RCSL corresponding to write column selecting line WCSL at the high level is set to the high level (see FIG. 3(f)), and read sense amplifier activation signal $\phi$RSA is set to the low level as shown in FIG. 3(h). Therefore, in the selected block, transistors 720 and 730 in read data input circuits RD are turned on and read sense amplifier RSA is activated.

Now, the circuit operation for reading the data will be described below.

In the data reading operation, any one of memory cell array blocks MA operates as follows. The potential of one of word lines WL is set to high potential (Vcc+$\alpha$) as shown in FIG. 4(b), and the potential of one read column selecting lines RCSL rises to supply potential Vcc shown in FIG. 4(f). Meanwhile, the equalization signal $\phi$EQ falls, as shown in FIG. 4(a), to the ground potential Vss prior to the rise of potential of the one word line WL, and read sense amplifier activation signal $\phi$RSA falls to the ground potential Vss at substantially the same timing as the rise of potential of the one word line WL.

Meanwhile, all write column selecting lines WCSL are set to the ground potential Vss, as shown in FIG. 4(g). Therefore, in each block, all bit line pairs BL and /BL are electrically isolated from write data line pairs WDB and /WDB.

Thus, only in the selected block, as shown in FIG. 4(c), the potential of each bit line BL, /BL slightly rises or lowers as in the conventional DRAM, depending on the stored data in memory cell MC, in response to the rise of potential of one word line WL, so that a slight potential difference is generated between two bit lines BL and /BL forming each bit line pair.

The potential difference generated between selected bit lines BL and /BL appears between read data lines RDB and /RDB after being amplified owing to the operations of corresponding read data input circuit RD and write sense amplifier WSA as well as the conventional operation of read sense amplifier RSA.

Sense amplifier activation signals $\phi$pSA and $\phi$nSA go to supply potential Vcc and the ground potential Vss with a considerable delay after the rise of potential of word line WL, as is done in the prior art (see FIGS. 4(d) and 4(e)), so that write sense amplifier WSA is activated after the activation of read sense amplifier RSA, as in the prior art.

In the data reading operation, all the blocks receive write block selection signals $\phi$WBS at the low level (FIG. 4(i)). Therefore, in all the blocks, transistors 800 and 810 in write data line precharge circuits WDP are turned on, so that both write data lines WDB and /WDB are precharged to intermediate potential Vb1.

As described above, in the data reading operation, the data signal, which appears on selected bit line pair BL and /BL on the same principle as the conventional DRAM of separated I/O type, is transmitted to read sense amplifier RSA. Therefore, it is not necessary to delay the start timing of the operation of read sense amplifier RSA from the timing of rise of the potential of word line WL, which enables the reduction of the access time.

Now, with reference to FIG. 5, a method for generating a control signal, which is required in the embodiment, will be described.

Figure 5:
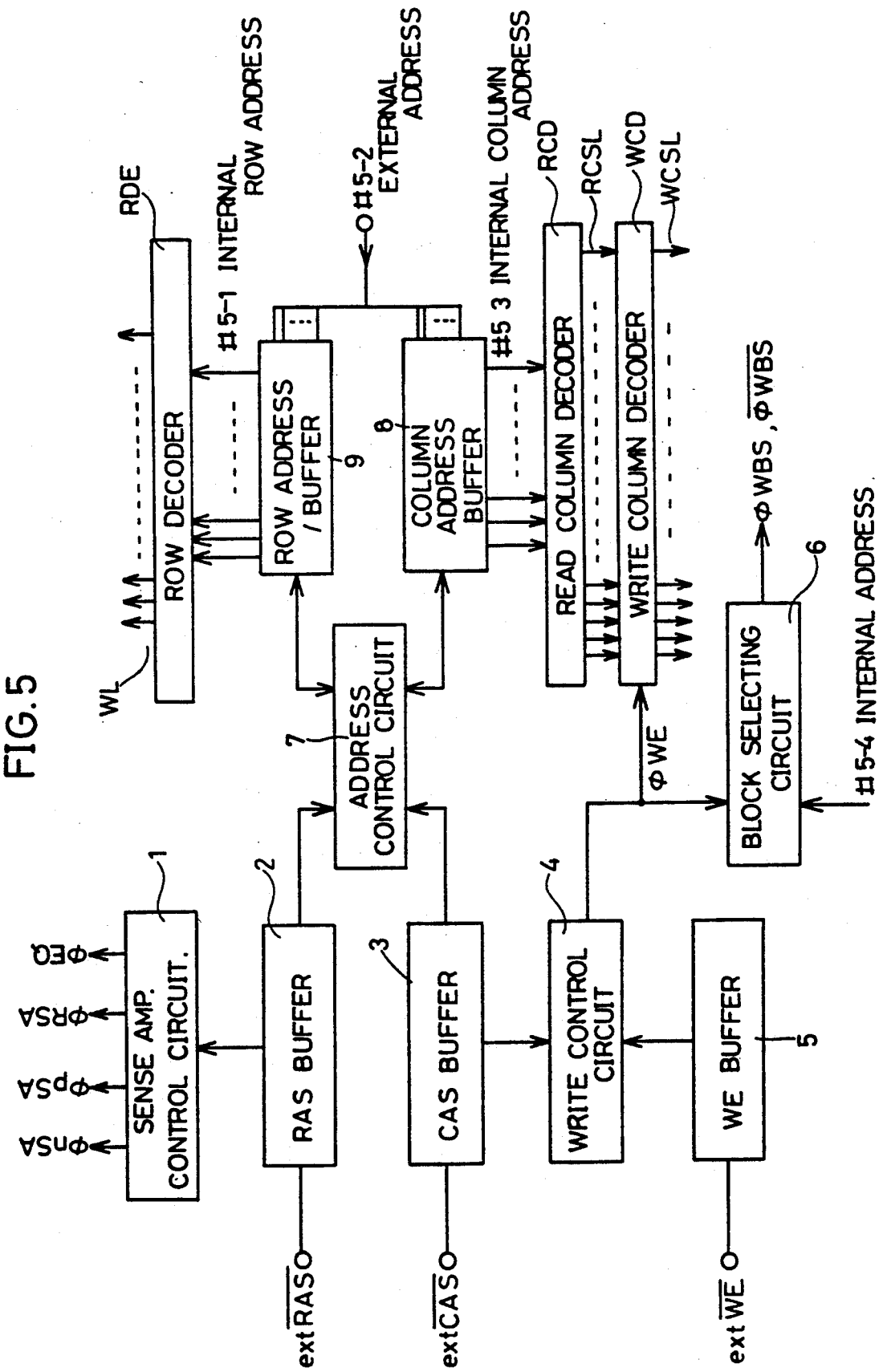
FIG. 5 is a block diagram showing a circuitry for generating a control signal in FIG. 2.

FIG. 5 is a schematic block diagram showing a control signal generating system in the DRAM of the embodiment. Circuits or components shown in FIG. 5 are disposed around the circuitry shown in FIG. 1, in practice.

With reference to FIG. 5, an RAS buffer 2 buffers externally applied low active row address strobe signal /RAS to apply the same to a sense amplifier control circuit 1 and an address control circuit 7. Similarly, a CAS buffer 3 buffers externally applied low active column address strobe signal /CAS to apply the same to address control circuit 7 and a write control circuit 4.

Sense amplifier control circuit 1 is responsive to an output of RAS buffer 2 to provide sense amplifier activation signals $\phi$nSA and $\phi$pSA as well as read sense amplifier activation signal $\phi$RSA and equalization signal $\phi$EQ.

Address control circuit 7 controls row address buffer 9 and column address buffer 8 on basis of output signals of RAS buffer 2 and CAS buffer 3.

Under control of address control circuit 7, row address buffer 9 applies a signal provided by buffering a row address signal designating an address of any one row of memory cells of any one memory array block MA out of external address signals, to row decoder RD as an internal row address signal.

Column address buffer 8 applies to read column decoder RCD an internal column address signal, which is contained in externally applied address signals and obtained by buffering a column address signal which designates an address of any one columns of memory cells in any one of memory cell array blocks MA in FIG. 1.

Row decoder RDE raises the potential of one word line WL connected to the memory cell row at the address indicated by internal row address signal in the data writing and reading operations.

In the data reading operation, read column decoder RCD applies the potential at the high level only to one read column selecting line RCSL provided correspondingly to the memory cell column at the address indicated by the internal column address signal, and applies the potential at the low level to all remaining read column selecting lines RCSL.

As shown in FIGS. 1 and 5, the output signal of read column decoder RCD is applied to write column decoder WCD. Write column decoder WCD is responsive to the output of read column decoder RCD and write enable signal $\phi$WE to set the potential of one write column selecting line WCSL, which is provided corresponding to the memory cell column at the address indicated by the internal column address signal, at the high level and the potentials of all remaining write column selecting lines WCSL potential at the low level in the data writing operation.

A WE buffer 5 buffers externally applied low active write enable signal /WE to apply the same to a write control circuit 4.

Write control circuit 4 is responsive to the output signals of CAS buffer 3 and WE buffer 5 to generate write enable signal $\phi$WE, which is at the high level in the data writing operation and is at the low level in the data reading operation.

Write enable signal $\phi$WE is applied to write column decoder WCD as well as a block selecting circuit 6.

Block selecting circuit 6 is responsive to the internal row address signal supplied from row address buffer 9 and the internal row address signal supplied from column address buffer 8 as well as write enable signal $\phi$WE to generate write block selection signal $\phi$WBS and the inverted signal of the same. Write block selection signal $\phi$WBS is set at the high level only in the block to which the memory cell row indicated by the internal row address signal belongs, in the data writing operation, and is set at the low level in all the blocks in the data reading operation.

Figure 6:
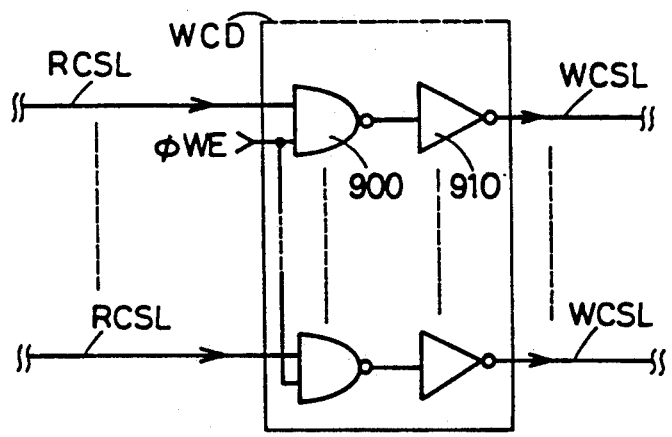
FIG. 6 is a circuit diagram showing a structure of a write column decoder in FIGS. 1 and 5.
Figure 7:
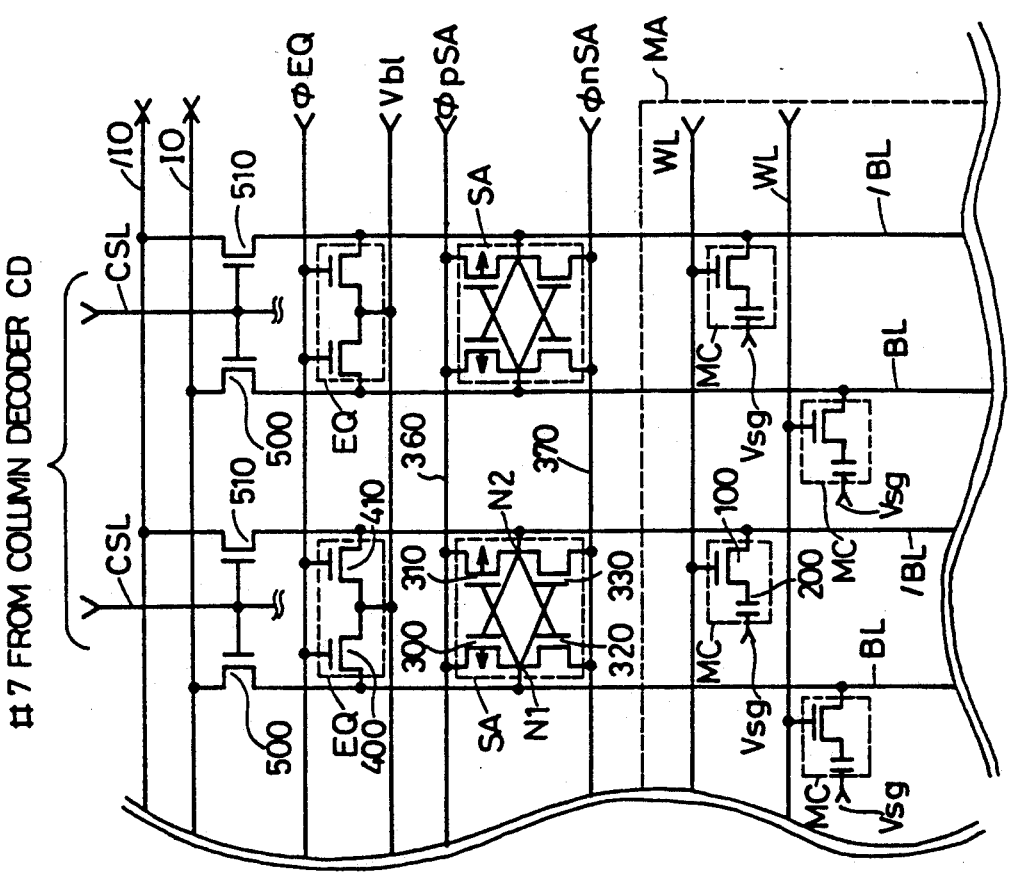
FIG. 7 is a circuit diagram showing a structure of a major part of a DRAM of common I/O type.
Figure 8:
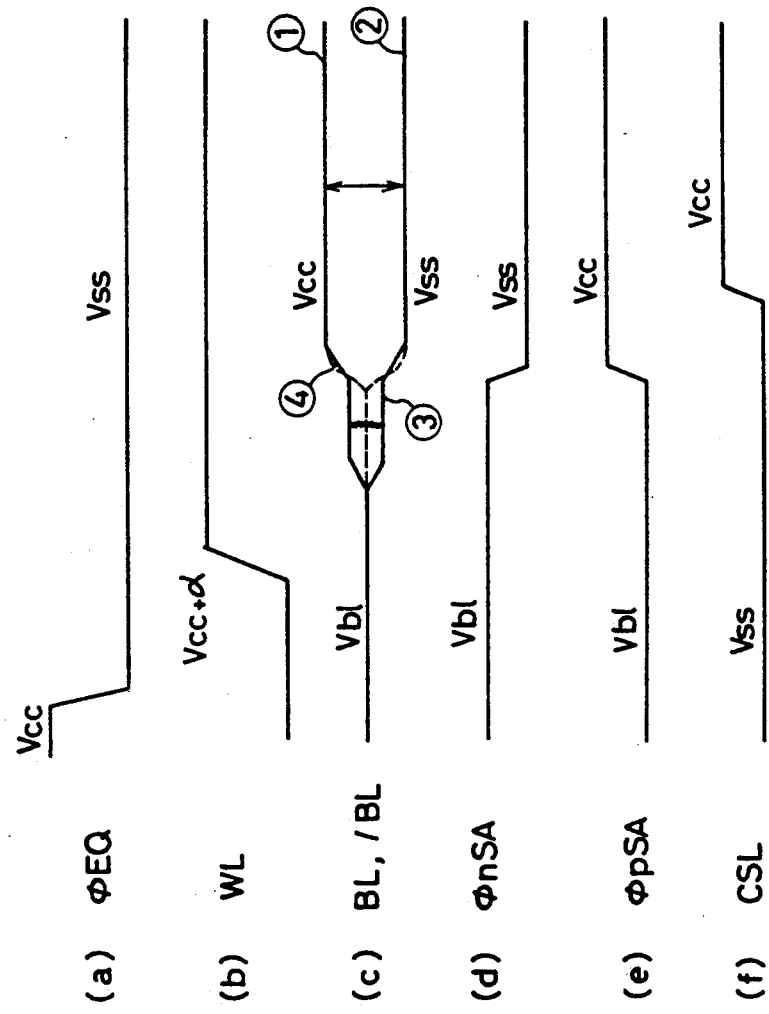
FIG. 8(a)-(f) is a timing chart showing a circuit operation in a data reading of a DRAM shown in FIG. 7.

FIG. 6 is a circuit diagram showing an example of a construction of write column decoder WCD.

Referring to FIG. 6, write column decoder WCD receives the output signal of read column decoder RCD through read column selecting lines RCSL, and includes NAND gates 900 and inverters 910 corresponding to respective read column selecting lines RCSL.

Each NAND gate 900 receives, as inputs, the potential of corresponding read column selecting line RCSL and write enable signal $\phi$WE. Each inverter 910 inverts the output signal of corresponding NAND gate 900. The output signal of each inverter 910 is applied to write column selecting line WCSL.

In the data reading operation, write enable signal $\phi$WE is at the low level, so that the output potential of each NAND gates 900 in the write column decoder WCD is at the high level, regardless of the potential of corresponding read column selecting line RCSL. Therefore, the potential at the low level is applied to each write column selecting line WCSL from corresponding inverter 910.

In the data writing operation, the write enable signal $\phi$WE is at the high level as shown in FIG. 3(h), so that the output potential of each NAND gate 900 is determined by the potential level of corresponding read column selecting line RCSL.

In the data writing and reading operations, read column decoder RCD sets only the potential of any one of read column selecting lines RCSL at the high level. Therefore, the potential of one NAND gate 900 corresponding to one read column selecting line RCSL, which is provided corresponding to the memory cell column indicated by the internal column address signal, goes to the low level, and output potentials of all remaining NAND gates 900 go to the high level. Consequently, only one write column selecting line WCSL, which is provided corresponding to the memory cell column at the address indicated by the internal column address signal, receives the potential at the high level from corresponding inverter 910.

As described above, in this embodiment, write column decoder WCD operates in response to the output of read column decoder RCD. Therefore, the time required for raising the potential of one write column selecting line WCSL by write column decoder WCD in response to the external address signal in the data writing operation, is slightly longer than the time required for raising the potential of one read column selecting line RCSL by read column decoder RCD in response to the external address signal in the data reading operation. Therefore, in the selected block, the time required for transmitting the write data signal, which is transmitted to write data line pair WDB and /WDB from common write data line pair GWDB and /GWDB, to selected bit line pair BL and /BL is slightly longer than the time required for the variation of the potentials of selected bit line pair BL and /BL in the selected block to be transmitted through corresponding read data input circuit RD to read data line pair RDB and /RDB in the data reading operation.

In the data writing operation, however, it requires a certain time for the externally applied write data signal to be amplified by the write buffer (not shown) to the potential level which is necessary for applying the same to common write data line pair GWDB and /GWDB. Therefore, even if one bit line pair BL and /BL in the selected block immediately responds to the input of the externally applied write data signal by being electrically connected to read data line pair WDB and /WDB in the data writing operation, it requires a certain time for generating the potential difference, which corresponds to the write data signal, in the one bit line pair BL and /BL. Thus, in the data writing operation, even if the potential of write column selecting line WCSL in the selected block rises relatively slowly, the time required for writing the data is not increased by the time delay of the rising of write column selecting line WCSL.

In a conventional structure of the column decoder, the internal column address signal is generally used as the input. For example, write column decoder WCD may have a structure in which it directly receives the output signals of column address buffer 8 to decode the same, which is similar to read column decoder RCD. In the embodiment, however, write column decoder WCD directly receives the output signals of read column decoder RCD, i.e., the signals obtained by decoding internal column address signal, in which case the circuit for the decoding is not required (see FIG. 6).

Accordingly, write column decoder WCD in the embodiment can be easily formed by a small number of circuit elements, and thus the chip area in the DRAM does not increase. Since the signal lines for supplying the output signals of column address buffer 8 to write column decoder WCD are not required, the increase of the capacity and resistance of the signal lines to be driven by column address buffer 8, i.e., the increase of the load on column address buffer 8 is suppressed.

In the above embodiment, read column decoder RCD and write column decoder WCD are opposed to each other with memory cell array blocks therebetween. Read column decoder RCD and write column decoder WCD, however, may be disposed in different manners.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of blocks each including a plurality of memory cells disposed in a plurality of rows and a plurality of columns, and a plurality of bit lines provided corresponding to said plurality of columns;

first selecting means for selecting any of said plurality of bit lines in each of said plurality of blocks in a data writing operation;

second selecting means for selecting any of said plurality of bit lines in each of said plurality of blocks in a data reading operation;

block selecting means for selecting any of said plurality of blocks;

a plurality of write data bus means provided corresponding to said plurality of blocks each receiving write data;

a plurality of connecting means provided corresponding to said plurality of blocks each for electrically connecting said bit line selected by said first selecting means in the corresponding block to the corresponding write data bus means;

a plurality of read data bus means provided corresponding to said plurality of blocks each for externally transmitting read data;

a plurality of transmitting means provided corresponding to said plurality of blocks each for transmitting potential variation in said bit line selected by said second selecting means in the corresponding block to the corresponding read data bus means;

a plurality of read amplifier means provided corresponding to said plurality of blocks each for amplifying said potential variation transmitted by the corresponding transmitting means;

a plurality of equalizer means provided corresponding to said plurality of blocks each for equalizing all of said bit lines in the corresponding block to a predetermined potential Vb1, when the corresponding block is not selected by said block selecting means; and a plurality of precharging means provided corresponding to said plurality of blocks each for precharging the corresponding write data bus means to said predetermined potential, when the corresponding block is not selected by said block selecting means in data writing operation.

2. The semiconductor memory device according to claim 1, further comprising common write data bus means provided commonly corresponding to said plurality of blocks for receiving said write data externally applied thereto, wherein each of said plurality of precharging means includes first switching means for electrically connecting the corresponding write data bus means to said common write data bus means for a period in which the corresponding block is selected by said block selecting means in said data writing operation, and for electrically isolating the corresponding write data bus means from said common write data bus means in said data reading operation and for other periods in said data writing operation; and second switching means for electrically coupling the corresponding write data bus means to said predetermined potential in said data reading operation and for a period in which the corresponding block is not selected by said block selecting means in said data writing operation, and for electrically isolating the corresponding data bus means from said predetermined potential for a period in which the corresponding block is selected by said block selecting means in said data writing operation.

3. The semiconductor memory device according to claim 2, wherein each of said first switching means includes a first field effect semiconductor element having a first conductive terminal connected to the corresponding write data bus means, a second conductive terminal connected to said common write data bus means, and a control terminal for receiving a first control signal; and each of said second switching means includes a second field effect semiconductor element having a first conductive terminal connected to the corresponding write data bus means, a second conductive terminal for receiving said predetermined potential, and a control terminal receiving a second control signal having a logical level complementary to said first control signal.

4. The semiconductor memory device according to claim 3, wherein said block selecting means supplies, to each of said plurality of blocks, a signal of a first logical level indicating selection of that block or a signal of a second level indicating non-selection of that block as said first control signal in response to a data write designating signal designating data write mode in the semiconductor device and to an address signal, and supplies as said second control signal, a signal of said second logical level to each of said plurality of blocks in response to a signal designating a mode other than said data write mode, regardless of said address signal.

5. The semiconductor memory device according to claim 4, wherein each of said plurality of connecting means includes a plurality of third switching means connected between said plurality of bit lines in the corresponding block and the corresponding write data bus means, respectively, and controlled independently from each other by said first selecting means; and each of said plurality of transmitting means includes a plurality of fourth switching means, connected between said plurality of bit lines in the corresponding block and the corresponding read data bus means, respectively, and controlled independently from each other by said second selecting means.

6. The semiconductor memory device according to claim 5, wherein said second selecting means includes first decoding means for decoding said address signal to generate a third control signal for turning on only one of said fourth switching means in each of said plurality of blocks and turning off all other fourth switching means in each of said plurality of blocks; and said first selecting means includes second decoding means responsive to said third control signal generated by said first decoding means and to said data write instructing signal for generating a fourth control signal, which turns on only one of said third switching means in each of said plurality of blocks and turns off all other third switching means in the data writing operation, and turns off all of said third switching means in each of said plurality of blocks in said data reading operation.

7. The semiconductor memory device according to claim 6, wherein said third control signal includes a plurality of transmission control signals for controlling said plurality of third switching means included in each of said plurality of blocks, respectively;

said plurality of transmission control signals are commonly applied to said plurality of blocks;

said fourth control signal includes a plurality of connection control signals for controlling said plurality of fourth switching means included in each of said plurality of blocks, respectively; and said plurality of connection control signals are commonly applied to said plurality of blocks.

8. The semiconductor memory device according to claim 7, wherein said second decoding means includes a plurality of logic circuit means provided corresponding to said plurality of transmission of control signals, each for generating a logical product signal of the corresponding transmission control signal and said data write instructing signal; and output signals of said plurality of said logic circuit means are used as said plurality of connection control signals, respectively.

9. The semiconductor memory device according to claim 1, wherein said predetermined potential is an intermediate potential between a power supply potential and a ground potential.

10. The semiconductor memory device according to claim 1, wherein each of said memory cells is a dynamic memory cell.

11. A semiconductor memory device comprising:

a plurality of blocks each including a plurality of dynamic memory cells disposed in a plurality of rows and a plurality of columns, and a plurality of bit line pairs provided correspondingly to said plurality of columns;

first selecting means for selecting any of said plurality of bit line pairs in each of said blocks in a data writing operation;

second selecting means for selecting any of said plurality of bit line pairs in each of said plurality of blocks in a data reading operation;

block selecting means for selecting any of said plurality of blocks; and a plurality of write data line pairs provided corresponding to said plurality of blocks each for receiving write data; wherein each of said bit line pairs includes first and second bit lines, and each of said write data line pairs includes first and second write data lines;

said semiconductor memory device further comprising;

a plurality of connecting means which are provided corresponding to said plurality of blocks, each for electrically connecting said first and second bit lines included in the bit line pair selected by said first selecting means to said first and second write data lines included in the corresponding write data line pair, in the corresponding block, a plurality of read data line pairs provided corresponding to said plurality of blocks, each for externally transmitting read data, each of said plurality of read data line pairs including first and second read data lines;

a plurality of transmitting means provided corresponding to said plurality of blocks, each for transmitting potential variation in said first and second bit lines included in the bit line pair selected by said second selecting means to said first and second read data lines included in the corresponding read data line pair, in the corresponding block;

a plurality of read amplifier means provided corresponding to said plurality of blocks, each for amplifying potential difference between said first and second read data lines included in the corresponding read data line pair;

a plurality of equalizer means provided corresponding to said plurality of blocks each for equalizing said first and second bit lines included in each of said plurality of bit line pairs in the corresponding block, to a predetermined potential, when the corresponding block is not selected by said block selecting means; and a plurality of precharging means provided corresponding to said plurality of blocks, each for precharging said first and second write data lines included in the corresponding write data line pair, to said predetermined potential, when the corresponding block is not selected by said block selecting means in the data writing operation.

12. The semiconductor memory device according to claim 11, further comprising a common write data line pair provided commonly corresponding to said plurality of blocks, receiving said write data externally applied thereto, wherein each of said precharging means includes:

first switching means for electrically connecting the corresponding write data line pair to said common write data line pair for a period in which the corresponding block is selected by said block selecting means in said data writing operation, and for electrically isolating the corresponding data line pair from said common write data line pair in said data reading operation and for other periods in said data writing operation; and second switching means for electrically coupling the corresponding write data line pair to said predetermined potential in said data reading operation and for a period in which the corresponding block is not selected by said block selecting means in said data writing operation, and for electrically isolating the corresponding data line pair from said predetermined potential for a period in which the corresponding block is selected by said block selecting means in said data writing operation.

13. A semiconductor memory device comprising:

a plurality of blocks each including a plurality of memory cells disposed in a plurality of rows and a plurality of columns, and a plurality of bit lines provided corresponding to said plurality of columns;

first selecting means for selecting any of said plurality of bit lines in each of said plurality of blocks in a data writing operation;

second selecting means for selecting any of said plurality of bit lines in each of said plurality of blocks in a data reading operation;

block selecting means for selecting any of said plurality of blocks;

a plurality of write data bus means provided corresponding to said plurality of blocks each receiving write data;

a plurality of connecting means provided corresponding to said plurality of blocks each for electrically connecting said bit line selected by said first selecting means in the corresponding block to the corresponding write data bus means;

a plurality of read data bus means provided corresponding to said plurality of blocks each for externally transmitting read data;

a plurality of transmitting means provided corresponding to said plurality of blocks each for transmitting potential variation in said bit line selected by said second selecting means in the corresponding block to the corresponding read data bus means;

a plurality of read amplifier means provided corresponding to said plurality of blocks each for amplifying said potential variation transmitted by the corresponding transmitting means;

a plurality of equalizer means provided corresponding to said plurality of blocks each for equalizing all of said bit lines in the corresponding block to a predetermined potential Vb1, when the corresponding block is not selected by said block selecting means; and a plurality of precharging means provided corresponding to said plurality of blocks each for precharging the corresponding write data bus means to said predetermined potential, when the corresponding block is not selected by said block selecting means in data writing operation, said first selecting means being responsive to a selected output from said second selecting means and a control signal instructing said data writing for generating a signal selecting any one of said plurality of bit lines.

14. An operation method of a semiconductor memory device including a plurality of blocks, each including memory cells disposed in a plurality of rows and a plurality of columns, a plurality of bit lines provided corresponding to said plurality of columns, a write data bus for receiving write data, and a read data bus for externally transmitting read data, said method comprising the steps of:

selecting any of said plurality of bit lines in each of said plurality of blocks in a data writing operation;

selecting any of said plurality of bit lines in each of said plurality of blocks in a data reading operation;

selecting any of said plurality of blocks;

electrically connecting the selected bit line to the corresponding write data bus in each of said plurality of blocks;

transmitting potential variation in the selected bit line to the corresponding read data bus in each of said plurality of blocks;

electrically amplifying said transmitted potential variation;

equalizing all of said bit lines in the unselected block to a predetermined potential; and precharging said write data bus in the unselected block to said predetermined potential.

* * * * *